United States Patent
Kajitani et al.

(10) Patent No.: US 10,249,748 B2
(45) Date of Patent: Apr. 2, 2019

(54) NITRIDE SEMICONDUCTOR DEVICE

(71) Applicant: PANASONIC CORPORATION, Osaka (JP)

(72) Inventors: Ryo Kajitani, Osaka (JP); Daisuke Shibata, Kyoto (JP); Kenichiro Tanaka, Osaka (JP); Masahiro Ishida, Osaka (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 15/695,904

(22) Filed: Sep. 5, 2017

(65) Prior Publication Data

US 2017/0365698 A1 Dec. 21, 2017

Related U.S. Application Data

(63) Continuation of application No. PCT/JP2016/000802, filed on Feb. 17, 2016.

(30) Foreign Application Priority Data

Mar. 11, 2015 (JP) .................................. 2015-048694

(51) Int. Cl.
*H01L 29/72* (2006.01)
*H01L 29/778* (2006.01)
(Continued)

(52) U.S. Cl.
CPC .......... *H01L 29/778* (2013.01); *H01L 29/808* (2013.01); *H01L 29/812* (2013.01);
(Continued)

(58) Field of Classification Search
None
See application file for complete search history.

(56) References Cited

U.S. PATENT DOCUMENTS 9,735,260 B2 *  8/2017  Sugimoto ......... H01L 29/66462
2003/0178672 A1  9/2003  Hatakeyama et al.
(Continued)

FOREIGN PATENT DOCUMENTS

JP  2004-006723 A  1/2004
JP  2006-186336 A  7/2006
(Continued)

OTHER PUBLICATIONS

International Search Report issued in corresponding International Application No. PCT/JP2016/000802, dated Apr. 19, 2016 with English Abstract.

*Primary Examiner* — Michael Lebentritt
(74) *Attorney, Agent, or Firm* — McDermott Will & Emery LLP

(57) ABSTRACT

A nitride semiconductor device includes: a substrate of a first conductivity type having a first surface and a second surface on a side of the substrate opposite the first surface; a first nitride semiconductor layer of the first conductivity type which is disposed on the first surface of the substrate and includes an acceptor impurity; a second nitride semiconductor layer of a second conductivity type disposed on the first nitride semiconductor layer, the second conductivity type being opposite to the first conductivity type; a first electrode disposed on the second surface of the substrate; a second electrode disposed on the first nitride semiconductor layer; and a gate electrode disposed on the second nitride semiconductor layer.

19 Claims, 12 Drawing Sheets

(51) Int. Cl.
*H01L 29/808* (2006.01)
*H01L 29/812* (2006.01)
*H01L 29/08* (2006.01)
*H01L 29/10* (2006.01)
*H01L 29/20* (2006.01)

(52) U.S. Cl.
CPC .............. *H01L 29/08* (2013.01); *H01L 29/10* (2013.01); *H01L 29/2003* (2013.01); *H01L 29/72* (2013.01)

(56) References Cited

U.S. PATENT DOCUMENTS

| | | | | |
|---|---|---|---|---|
| 2005/0189561 | A1* | 9/2005 | Kinzer | H01L 27/0605 257/192 |
| 2006/0157804 | A1 | 7/2006 | Ueda | |
| 2007/0117355 | A1 | 5/2007 | Ueda et al. | |
| 2007/0284616 | A1 | 12/2007 | Moon et al. | |
| 2008/0149940 | A1* | 6/2008 | Shibata | H01L 24/05 257/76 |
| 2010/0097105 | A1* | 4/2010 | Morita | H01L 27/0605 327/109 |
| 2010/0230723 | A1* | 9/2010 | Hashimoto | H01L 21/02389 257/194 |
| 2011/0037101 | A1* | 2/2011 | Nakazawa | H01L 27/0605 257/192 |
| 2011/0227132 | A1* | 9/2011 | Anda | H01L 29/42316 257/192 |
| 2012/0043551 | A1* | 2/2012 | Zhu | H01L 21/28581 257/76 |
| 2012/0153355 | A1* | 6/2012 | Umeda | H01L 29/2003 257/192 |
| 2013/0181255 | A1* | 7/2013 | Kiyama | H01L 29/66462 257/190 |
| 2013/0214287 | A1* | 8/2013 | Okamoto | H01L 21/8252 257/76 |
| 2014/0097468 | A1* | 4/2014 | Okita | H01L 29/42316 257/192 |
| 2014/0117376 | A1* | 5/2014 | Terano | H01L 29/402 257/76 |
| 2014/0191369 | A1* | 7/2014 | Tsuchiya | H01L 29/6631 257/615 |
| 2015/0221757 | A1* | 8/2015 | Nakayama | H01L 27/0605 257/20 |
| 2015/0243736 | A1* | 8/2015 | Kaneda | H01L 21/02576 257/76 |
| 2015/0303293 | A1* | 10/2015 | Tanaka | H01L 29/36 257/76 |
| 2016/0035719 | A1* | 2/2016 | Kanechika | H01L 29/66462 257/195 |
| 2016/0141405 | A1* | 5/2016 | Werner | H01L 29/7786 257/76 |
| 2016/0149024 | A1* | 5/2016 | Makabe | H01L 21/02378 257/76 |
| 2016/0284843 | A1* | 9/2016 | Niwa | H01L 29/2003 |
| 2016/0329421 | A1* | 11/2016 | Shibata | H01L 29/861 |
| 2016/0336437 | A1* | 11/2016 | Kajitani | H01L 29/7786 |
| 2017/0092493 | A1* | 3/2017 | Niwa | H01L 21/26546 |
| 2017/0104091 | A1* | 4/2017 | Tanaka | H01L 29/66431 |
| 2017/0155013 | A1* | 6/2017 | Miyoshi | H01L 33/32 |
| 2017/0256637 | A1* | 9/2017 | Isobe | H01L 29/2003 |
| 2018/0026099 | A1* | 1/2018 | Miyamoto | H01L 29/1087 |
| 2018/0026124 | A1* | 1/2018 | Shimizu | H01L 29/7787 |
| 2018/0151349 | A1* | 5/2018 | Watanabe | H01L 21/0262 |

FOREIGN PATENT DOCUMENTS

| | | |
|---|---|---|
| JP | 2007-142243 A | 6/2007 |
| JP | 2007-329466 A | 12/2007 |
| JP | 2010-165896 A | 7/2010 |
| JP | 2010-267881 A | 11/2010 |
| JP | 2013-168507 A | 8/2013 |

* cited by examiner

NITRIDE SEMICONDUCTOR DEVICE

CROSS REFERENCE TO RELATED APPLICATIONS

This application is a U.S. continuation application of PCT International Patent Application Number PCT/JP2016/000802 filed on Feb. 17, 2016, claiming the benefit of priority of Japanese Patent Application Number 2015-048694 filed on Mar. 11, 2015, the entire contents of which are hereby incorporated by reference.

BACKGROUND

1. Technical Field

The present disclosure relates to a semiconductor device, and particularly to a nitride semiconductor device.

2. Description of the Related Art

A Group III nitride semiconductor has a greater band gap and a higher breakdown electric field than conventional semiconductors including silicon (Si), and shows potential as a material for transistors with high breakdown-voltage (BV). A general structure of the Group III nitride semiconductor transistor includes a planar transistor which uses, as a channel, two-dimensional electron gas which is formed at a heterojunction interface of the Group III nitride semiconductor. However, since the planar transistor has a structure in which respective electrodes are arranged planarly on a surface, electric field strength is caused on a drain electrode end surface and the BV is prone to drop. On the other hand, with a vertical transistor in which a source electrode is disposed on a surface of the semiconductor and a drain electrode is disposed on a surface of the substrate, an electric field is applied evenly for the drain electrode, and thus a high BV can be expected (see Patent Literature (PTL) 1, Japanese Unexamined Patent Application Publication No. 2007-142243, for example).

SUMMARY

A Group III nitride semiconductor vertical transistor is required to have high BV and low on-resistance, and be normally-off from a viewpoint of security in device operation. In general, an n-type gallium nitride (GaN) layer doped with Si as a donor is used for a channel of a Group III nitride semiconductor vertical transistor. Here, if a Si doping concentration is set too high for the purpose of lowering the on-resistance, a large quantity of crystal defects are formed which causes significant decrease in the BV. Furthermore, since a current tends to flow between the source electrode and the drain electrode, the vertical transistor becomes normally-on. On the other hand, if the Si doping concentration is set low for the purpose of achieving normally-off and high BV, the on-resistance increases. Accordingly, in the conventional Group III nitride semiconductor vertical transistor, it was significantly difficult to satisfy normally-off, low on-resistance, and high BV.

In view of the above problems, the present disclosure has an object of providing a nitride semiconductor device capable of realizing a Group III nitride semiconductor vertical transistor having normally-off, low on-resistance, and high BV properties.

In order to achieve the above-described object, a nitride semiconductor device according to an aspect of the present disclosure includes: a substrate of a first conductivity type having a first surface and a second surface on a side of the substrate opposite the first surface; a first nitride semiconductor layer of the first conductivity type which is disposed on the first surface of the substrate and includes an acceptor impurity; a second nitride semiconductor layer of a second conductivity type disposed on the first nitride semiconductor layer, the second conductivity type being opposite to the first conductivity type; a first electrode disposed on the second surface of the substrate; a second electrode disposed on the first nitride semiconductor layer; and a gate electrode disposed on the second nitride semiconductor layer.

The present disclosure provides a Group III nitride semiconductor vertical transistor having normally-off, low on-resistance, and high BV properties.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

The following describes embodiments of a nitride semiconductor device according to the present disclosure in detail, with reference to the Drawings. Constituent elements representing substantially the same configurations may be assigned with the same reference numbers and the explanation may be omitted. Furthermore, in the embodiments described below, when manufacturing methods are substantially the same, the explanation may be omitted.

The present disclosure is determined not by the embodiments described below. The embodiments and variations in the present disclosure may be combined. Each of the embodiments described below is a mere example of the present disclosure. The numerical values, shapes, materials, constituent elements, the arrangement and connection of the constituent elements, etc. shown in the following embodiments are mere examples, and thus do not limit the present disclosure. Accordingly, out of the constituent elements in the following embodiments, the constituent elements not stated in the independent claims are not necessary for achieving the object of the present disclosure and are described as arbitrary constituent elements.

Regarding the semiconductor device according to the embodiments described below, a first conductivity type is an N-type and a second conductivity type is a P-type. Note that plan views are hatched to correspond to cross-sectional views, to help understanding of structures of the semiconductor device according to the embodiments.

Embodiment 1

Hereinafter, semiconductor device 100 according to Embodiment 1 will be described as an aspect of the nitride semiconductor device in the present disclosure.

1. Structure of Semiconductor Device

Figure 1:
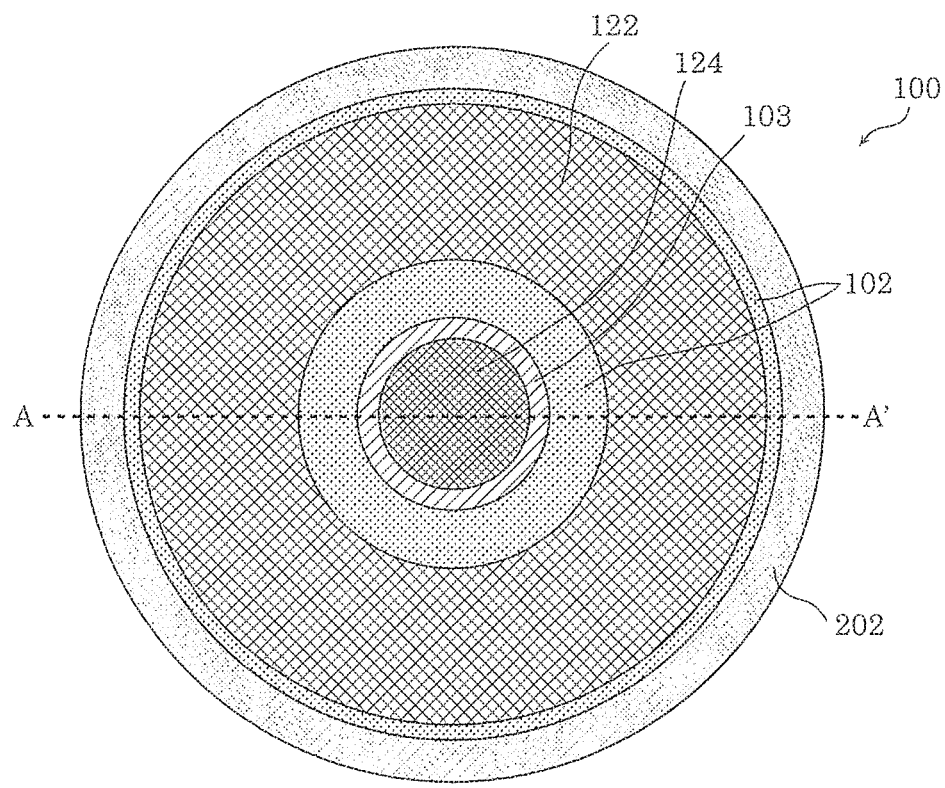
FIG. 1 is a plan view of a nitride semiconductor device according to Embodiment 1.
Figure 2:
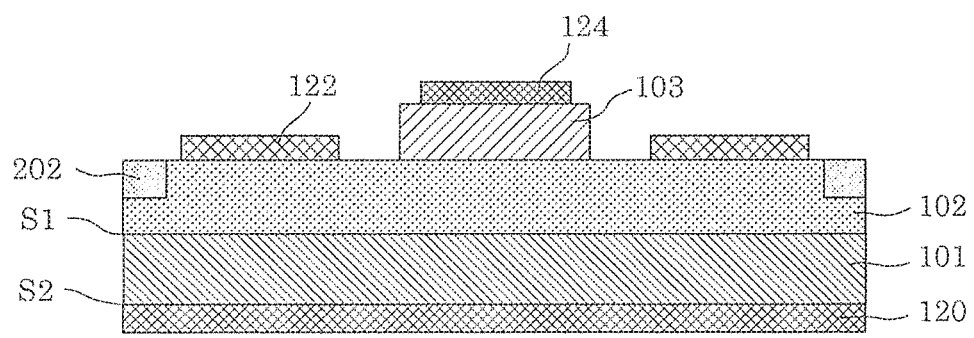
FIG. 2 is a cross-sectional view, at an A-A' line in FIG. 1, of the semiconductor device according to Embodiment 1.

FIG. 1 is a plan view of semiconductor device 100 according to Embodiment 1. FIG. 2 is a cross-sectional view, at an A-A' line in FIG. 1, of semiconductor device 100 according to Embodiment 1. In the present disclosure, "in a plan view" indicates a case where substrate 101 is being looked at from a normal direction of the major surface of substrate 101. Note that plan views are provided with the same patterns as the cross-sectional views, to help understanding of structures of the semiconductor device according to the present embodiment.

Nitride semiconductor device 100 according to Embodiment 1 includes: substrate 101 having first surface S1 and second surface S2 on a side of substrate 101 opposite first surface S1; first nitride semiconductor layer 102 which is disposed on first surface S1 of substrate 101; and second nitride semiconductor layer 103 disposed on first nitride semiconductor layer 102. Substrate 101 and first nitride semiconductor layer 102 are of the first conductivity type. Second nitride semiconductor layer 103 is of the second conductivity type.

Here, semiconductor device 100 corresponds to the nitride semiconductor device according to the present disclosure.

Semiconductor device 100 according to Embodiment 1 includes: first electrode 120 disposed on second surface S2 of substrate 101; second electrode 122 disposed on first nitride semiconductor layer 102; and gate electrode 124 disposed on second nitride semiconductor layer 103.

Substrate 101 is of the first conductivity type, and includes GaN, for example. First nitride semiconductor layer 102 is of the first conductivity type, and includes $In_xAl_yGa_{1-x-y}N$ ($0 \leq x \leq 1$, $0 \leq y \leq 1$, $0 \leq x+y \leq 1$), for example. Second nitride semiconductor layer 103 is of the second conductivity type, and includes $In_xAl_yGa_{1-x-y}N$ ($0 \leq x \leq 1$, $0 \leq y \leq 1$, $0 \leq x+y \leq 1$), for example.

First nitride semiconductor layer 102 includes an acceptor impurity. An acceptor impurity refers to an atom which supplies a hole. In the present disclosure, an acceptor atom to be injected to the semiconductor layer is referred to as an acceptor impurity. An example of the acceptor impurity includes carbon and transition metal. When first nitride semiconductor layer 102 includes carbon, a carbon concentration may be in a range between $1 \times 10^{16}/cm^2$ and $1 \times 10^{19}/cm^2$, inclusive.

In general, when a nitride semiconductor layer is crystal grown, crystal defects and residual impurity serve as donors, and thus the nitride semiconductor layer naturally turns to n-type. The acceptor impurity included in first nitride semiconductor layer 102 partially compensates for these donors, which makes first nitride semiconductor layer 102 have a high insulation property.

First nitride semiconductor layer 102 and second nitride semiconductor layer 103 may have high aluminum (Al) composition (i.e. a value of y in $In_xAl_yGa_{1-x-y}N$) within a range in which adverse effects are not caused due to the distortion caused by a lattice mismatch against substrate 101. This structure increases the band gap of each layer, which improves the BV of the semiconductor device.

Second nitride semiconductor layer 103 includes magnesium, for example. A magnesium concentration of second nitride semiconductor layer 103 may be in a range between $5 \times 10^{17}/cm^2$ and $5 \times 10^{20}/cm^2$, inclusive.

In the semiconductor device according to Embodiment 1, as an example, substrate 101 is a GaN substrate of the first conductivity type, first nitride semiconductor layer 102 is a GaN layer of the first conductivity type, and second nitride semiconductor layer 103 is a GaN layer of the second conductivity type.

2. Operation of Semiconductor Device

2-1. Pattern 1

Here, an operation performed by semiconductor device 100 when first electrode 120 is a source electrode and second electrode 122 is a drain electrode will be described. The source electrode is an ohmic electrode. The drain electrode may be one of an ohmic electrode and a schottky electrode. Hereinafter, first electrode 120 is called as source electrode 120 and second electrode 122 is called as drain electrode 122, to help understanding.

Assume that, in semiconductor device 100 according to Embodiment 1, a voltage of 0 V is applied to gate electrode 124, a voltage of 0 V is applied to source electrode 120, and a voltage of +1000 V is applied to drain electrode 122, for example. Here, since gate electrode 124 and drain electrode 122 are to be arranged horizontally (in a direction parallel to the major surface of the substrate), the distance between gate electrode 124 and drain electrode 122 is set to approximately 20 μm, to avoid breakdown due to electric field strength to an end surface of drain electrode 122. Since first nitride semiconductor layer 102 having high insulation properties is formed between source electrode 120 and drain electrode 122, a high BV and normally-off are achieved.

Next, when a voltage greater than or equal to +3.4 V is applied to gate electrode 124, holes flow from second nitride semiconductor layer 103 to first nitride semiconductor layer 102. Since substrate 101 is an n-type GaN layer and first electrode 120 is a source electrode, electrons flow from substrate 101 to first nitride semiconductor layer 102.

Since electrons and holes are injected to first nitride semiconductor layer 102, the electrons and holes recombine with each other and light is emitted. When energy of the emitted light is greater than or equal to an equivalent of a band gap of the material included in first nitride semiconductor layer 102, the energy is immediately absorbed into first nitride semiconductor layer 102 and pairs of electrons and holes are formed. Since a high electric field is applied to first nitride semiconductor layer 102 between source electrode 120 and drain electrode 122, before these electrons and holes recombine, the electrons and the holes separate from each other, and the holes move closer to source electrode 120 side and the electrons move closer to drain electrode 122 side. A flow formed by the separated electrons and holes becomes a current.

The light is emitted as long as the voltage is applied to gate electrode 124, and thus the current keeps flowing. When the voltage applied to gate electrode 124 is set to 0 V, the light emission stops and the current flowing between source electrode 120 and drain electrode 122 becomes zero.

By the above steps, the light injection associated with the gate voltage application causes a current to flow to first nitride semiconductor layer 102 to which substantially no current is supposed to flow due to the high insulation property and high BV. The above structure allows switching by a semiconductor with high BV, low on-resistance, and normally-off properties.

2-2. Pattern 2

Here, an operation performed by semiconductor device 100 when first electrode 120 is a drain electrode and second electrode 122 is a source electrode will be described. The source electrode is an ohmic electrode. The drain electrode may be one of an ohmic electrode and a schottky electrode. Hereinafter, first electrode 120 is called as drain electrode 120 and second electrode 122 is called as source electrode 122, to help understanding.

Assume that a voltage of 0 V is applied to gate electrode 124, a voltage of 0 V is applied to source electrode 122, and a voltage of +1000 V is applied to drain electrode 120, for example. Since first nitride semiconductor layer 102 having high insulation properties is formed between source electrode 122 and drain electrode 120, a high BV and normally-off are achieved.

Next, a voltage greater than or equal to +3.4 V is applied to gate electrode 124. Then, holes flow from second nitride semiconductor layer 103 to first nitride semiconductor layer 102. Although first nitride semiconductor layer 102 has high insulation properties, there are residual donors which are donors not compensated for by the acceptor impurity. Recombination of electrons generated by the residual donors with holes causes light emission.

With the above structure, in the same manner as in pattern 1, in semiconductor device 100, the light is absorbed by first nitride semiconductor layer 102 and pairs of electrons and holes are formed. The pairs of electrons and holes separate due to an electric field between source electrode 122 and drain electrode 120, and the separated electrons and holes become a current. When the voltage at gate electrode 124 is set to 0 V, the light emission stops and the current flowing between source electrode 122 and drain electrode 120 becomes zero.

Furthermore, in the same manner as in pattern 1, by the above steps, the light injection associated with the gate voltage application causes a current to flow to first nitride semiconductor layer 102 to which substantially no current is supposed to flow due to the high insulation property and high BV. The above structure allows switching by a semiconductor with high BV, low on-resistance, and normally-off properties.

3. Manufacturing Method of Semiconductor Device

A manufacturing method of the semiconductor device according to Embodiment 1 will be described. Note that the order of manufacturing steps is provided as an example, and thus is not limited to the order described below. Those skilled in the art may change the order as appropriate.

First, first nitride semiconductor layer 102 is formed on a major surface of substrate 101 including GaN by Metal Organic Chemical Vapor Deposition (MOCVD). First nitride semiconductor layer 102 includes GaN having a carbon concentration of $3 \times 10^{16}/cm^2$ and has a film thickness of 12 μm, for example.

Next, second nitride semiconductor layer 103 is grown on first nitride semiconductor layer 102 by MOCVD. Second nitride semiconductor layer 103 includes p-type GaN having a magnesium concentration of $1 \times 10^{19}/cm^2$ and has a film thickness of 500 μm, for example.

Next, a resist is applied above second nitride semiconductor layer 103, and patterning is performed. After the resist patterning, dry-etching is performed on second nitride semiconductor layer 103.

Next, for example, boron ion is injected to first nitride semiconductor layer 102 to form element isolation portion 202.

Next, second electrode 122 is formed on first nitride semiconductor layer 102 which is exposed as a result of dry-etching of second nitride semiconductor layer 103. Second electrode 122 includes a titanium (Ti) layer having a film thickness of 20 nm and an Al layer having a film thickness of 200 nm disposed on the Ti layer, for example.

Next, first electrode 120 is formed on second surface S2 of substrate 101. First electrode 120 includes a Ti layer having a film thickness of 20 nm and an Al layer having a film thickness of 200 nm disposed on the Ti layer, for example.

Next, gate electrode 124 is formed on second nitride semiconductor layer 103. Gate electrode 124 includes a nickel (Ni) layer having a film thickness of 100 nm and a gold (Au) layer having a film thickness of 500 nm disposed on the Ni layer, for example.

4. Advantageous Effect

As described above, with semiconductor device 100 according to the present embodiment, the light injection associated with the gate voltage application causes a current to flow to first nitride semiconductor layer 102 to which substantially no current is supposed to flow due to the high insulation property and high BV. With this, a Group III nitride semiconductor vertical transistor with high BV, low on-resistance, and normally-off properties is achieved.

Variation 1 of Embodiment 1

Next, semiconductor device 100a according to Variation 1 of Embodiment 1 will be described.

Figure 3:
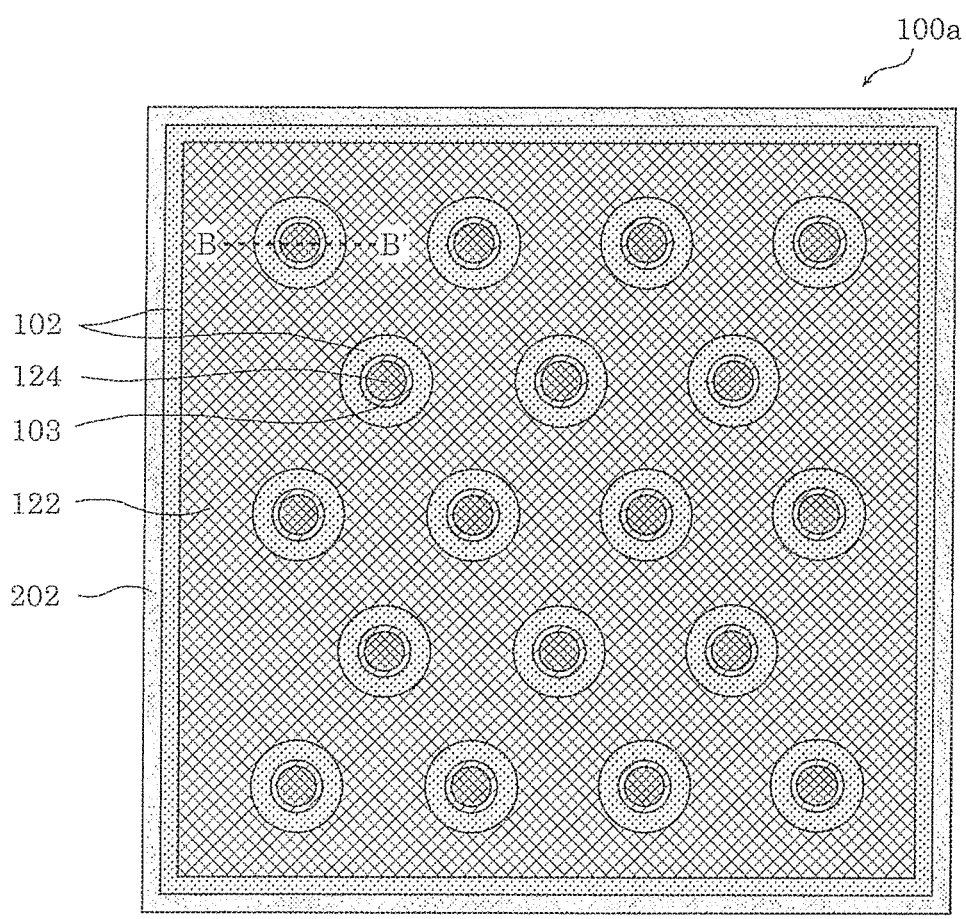
FIG. 3 is a plan view of a semiconductor device according to Variation 1 of Embodiment 1.
Figure 4:
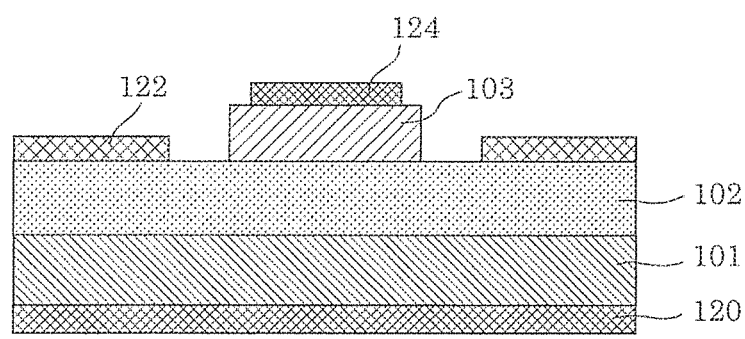
FIG. 4 is a cross-sectional view, at a B-B' line in FIG. 3, of the semiconductor device according to Variation 1 of Embodiment 1.

FIG. 3 is a plan view of semiconductor device 100a according to Variation 1 of Embodiment 1. FIG. 4 is a cross-sectional view, at a B-B' line in FIG. 3, of semiconductor device 100a.

As illustrated in FIG. 3, in semiconductor device 100a according to the present variation, in a plan view, plural circular second nitride semiconductor layers 103 are disposed on first nitride semiconductor layer 102. On each of plural second nitride semiconductor layers 103, gate electrode 124 is disposed as illustrated in FIG. 4. In addition, second electrode 122 is disposed between plural second nitride semiconductor layers 103. Plural gate electrodes 124 may be electrically connected to each other.

Note that, in a plan view, each of plural second nitride semiconductor layers 103 is not limited to have a circular shape but may have a multangular shape including square and so on. Furthermore, disposition of plural second nitride semiconductor layers 103 is not specifically limited, and any disposition may be adopted as long as the device works normally.

In semiconductor device 100a according to the present variation, it is possible to further suppress the on-resistance by setting, in a plan view, an area occupied by second electrode 122 greater than an area occupied by plural gate electrodes 124 to secure a large channel region between first electrode 120 and second electrode 122, i.e. between the source electrode and the drain electrode.

Variation 2 of Embodiment 1

Next, semiconductor device 100b according to Variation 2 of Embodiment 1 will be described.

Figure 5:
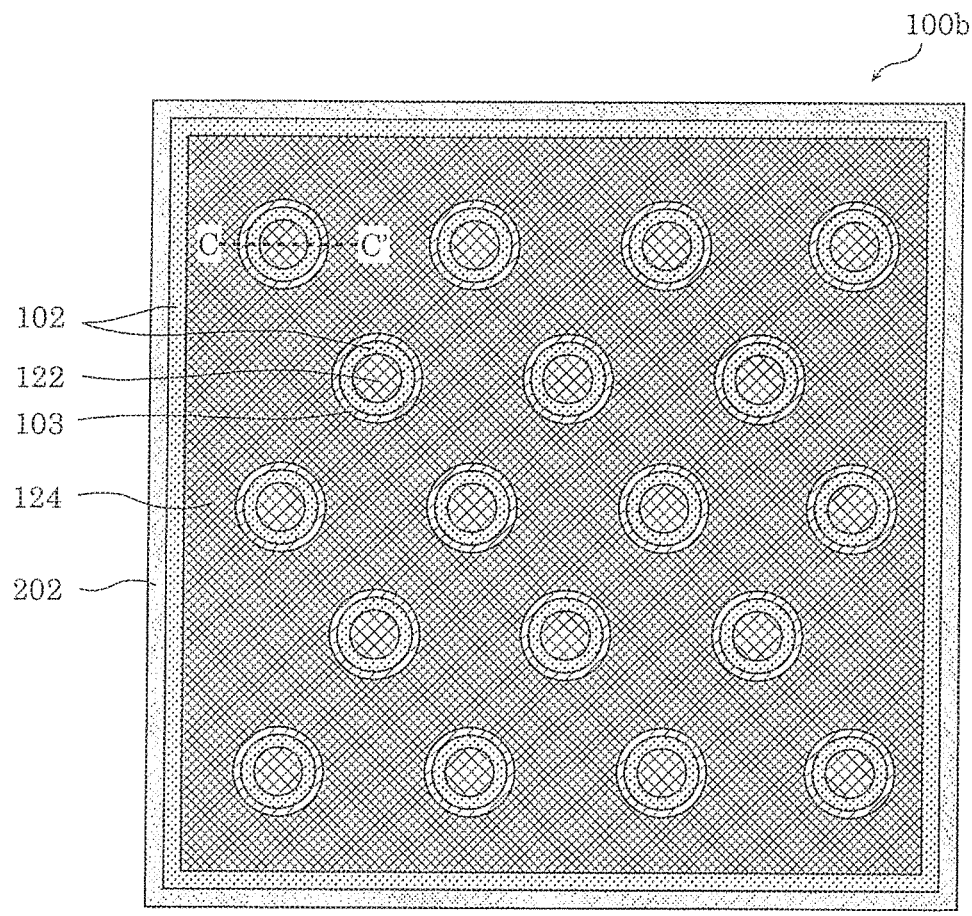
FIG. 5 is a plan view of a semiconductor device according to Variation 2 of Embodiment 1.
Figure 6:
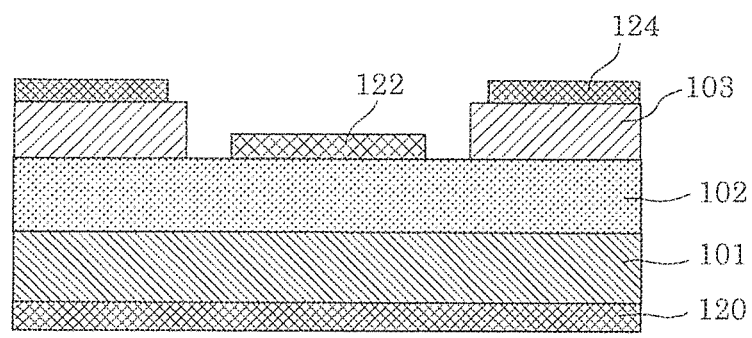
FIG. 6 is a cross-sectional view, at a C-C' line in FIG. 5, of the semiconductor device according to Variation 2 of Embodiment 1.

FIG. 5 is a plan view of semiconductor device 100b according to Variation 2 of Embodiment 1. FIG. 6 is a cross-sectional view, at a C-C' line in FIG. 5, of semiconductor device 100b according to Variation 2 of Embodiment 1.

As illustrated in FIG. 5, in semiconductor device 100b according to the present variation, in a plan view, plural circular second electrodes 122 are disposed on first nitride semiconductor layer 102. In addition, second nitride semiconductor layer 103 is disposed between plural second electrodes 122. On each of plural second nitride semiconductor layers 103, gate electrode 124 is disposed as illustrated in FIG. 6. Plural second electrodes 122 may be electrically connected to each other.

Note that, in a plan view, each of plural second electrodes 122 is not limited to have a circular shape but may have a multangular shape including square and so on. Furthermore, disposition of plural second electrodes 122 is not specifically limited, and any disposition may be adopted as long as the device works normally.

In semiconductor device 100b according to the present variation, in a plan view, an area occupied by gate electrode 124 may be set greater than an area occupied by plural second electrodes 122. Accordingly, the concentration of holes to be injected increases, which allows electrons and holes to recombine with a higher possibility.

Variation 3 of Embodiment 1

Next, semiconductor device 100c according to Variation 3 of Embodiment 1 will be described.

Figure 7:
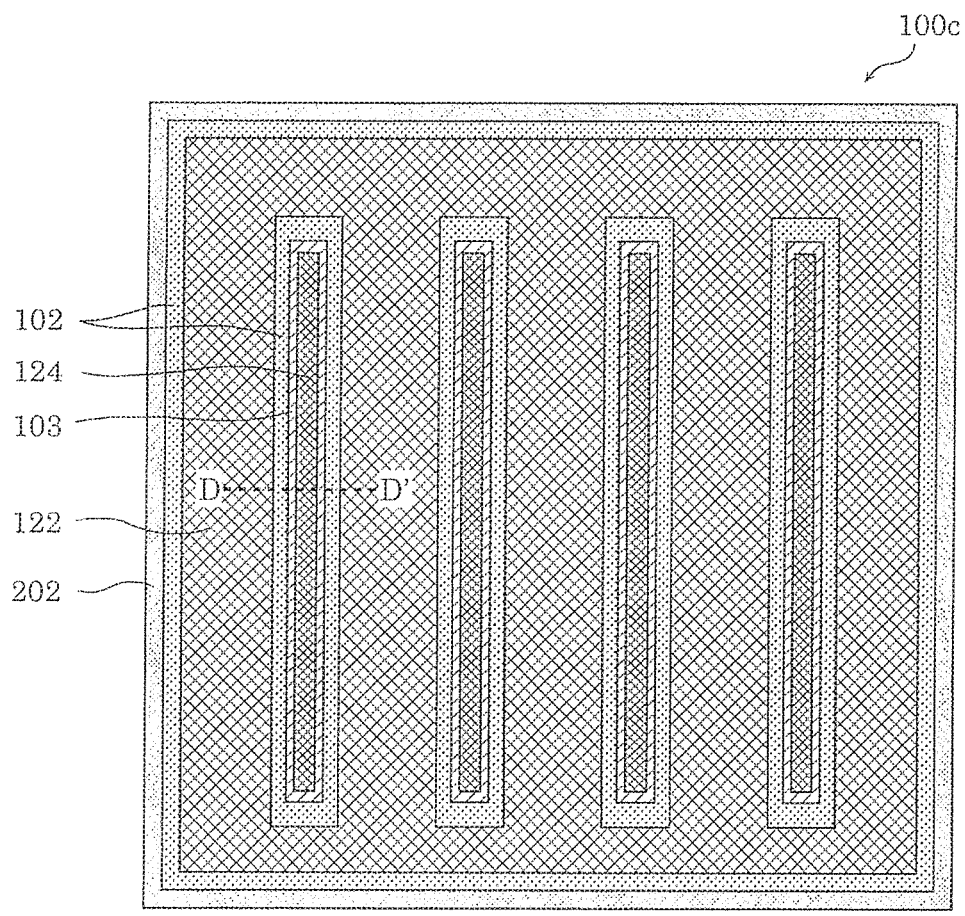
FIG. 7 is a plan view of a semiconductor device according to Variation 3 of Embodiment 1.
Figure 8:
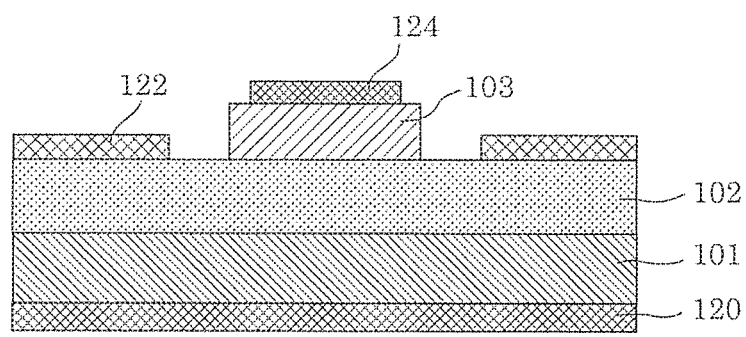
FIG. 8 is a cross-sectional view, at a D-D' line in FIG. 7, of the semiconductor device according to Variation 3 of Embodiment 1.

FIG. 7 is a plan view of semiconductor device 100c according to Variation 3 of Embodiment 1. FIG. 8 is a cross-sectional view, at a D-D' line in FIG. 7, of semiconductor device 100c according to Variation 3 of Embodiment 1.

As illustrated in FIG. 7, in semiconductor device 100c according to the present variation, in a plan view, plural linear second nitride semiconductor layers 103 are disposed on plural first nitride semiconductor layer 102. On each of plural second nitride semiconductor layers 103, gate electrode 124 is disposed as illustrated in FIG. 8. In addition, second electrode 122 is disposed between plural second nitride semiconductor layers 103. Plural gate electrodes 124 may be electrically connected to each other.

In semiconductor device 100c according to the present variation, it is possible to further suppress the on-resistance by setting, in a plan view, an area occupied by second electrode 122 greater than an area occupied by plural gate electrodes 124 to secure a large channel region between first electrode 120 and second electrode 122, i.e. between the source electrode and the drain electrode.

Variation 4 of Embodiment 1

Next, semiconductor device 100d according to Variation 4 of Embodiment 1 will be described.

Figure 9:
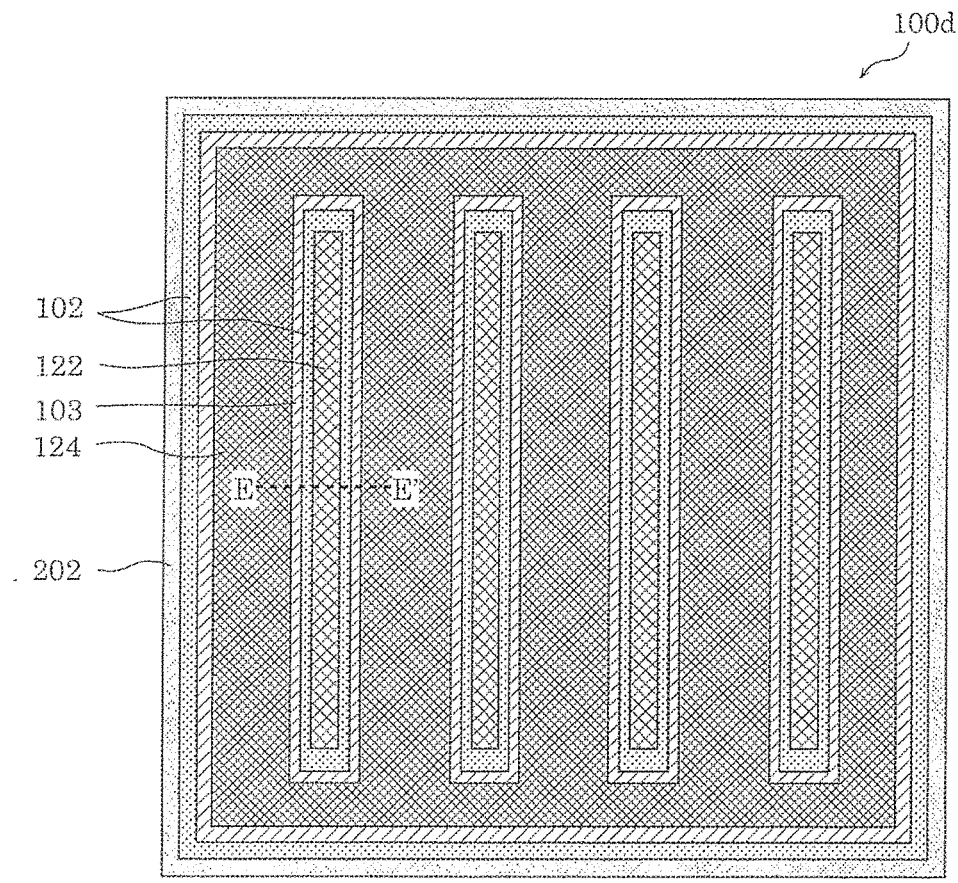
FIG. 9 is a plan view of a semiconductor device according to Variation 4 of Embodiment 1.
Figure 10:
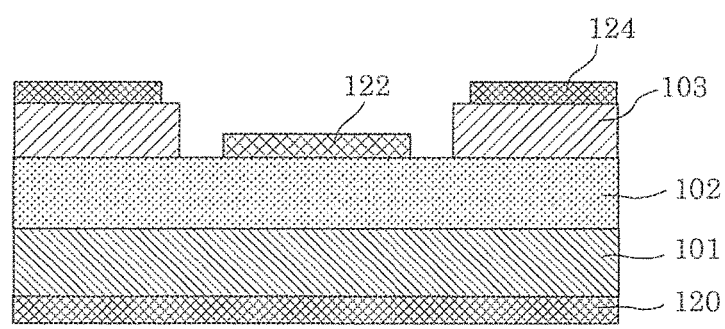
FIG. 10 is a cross-sectional view, at an E-E' line in FIG. 9, of the semiconductor device according to Variation 4 of Embodiment 1.

FIG. 9 is a plan view of semiconductor device 100d according to Variation 4 of Embodiment 1. FIG. 10 is a cross-sectional view, at an E-E' line in FIG. 9, of semiconductor device 100d according to Variation 4 of Embodiment 1.

As illustrated in FIG. 9, in semiconductor device 100d according to the present variation, in a plan view, plural linear second electrodes 122 are disposed on first nitride semiconductor layer 102. In addition, second nitride semiconductor layer 103 is disposed between plural second electrodes 122. On each of plural second nitride semiconductor layers 103, gate electrode 124 is disposed as illustrated in FIG. 10. Plural second electrodes 122 may be electrically connected to each other.

In semiconductor device 100d according to the present variation, even in a case where a light emission intensity is low under gate electrode 124, it is possible to secure a large light emission region by setting, in a plan view, an area occupied by gate electrode 124 greater than an area occupied by plural second electrodes 122. Accordingly, in semiconductor device 100d, the concentration of holes to be injected increases, which allows recombination of electrons and holes with a higher possibility and allows a current to flow more effectively. Here, an example of the case where the light emission intensity is low includes a case where Al compositions of first nitride semiconductor layer 102 and second nitride semiconductor layer 103 are set high for achieving a higher BV.

Embodiment 2

Next, semiconductor device 200 according to Embodiment 2 will be described.

Figure 11:
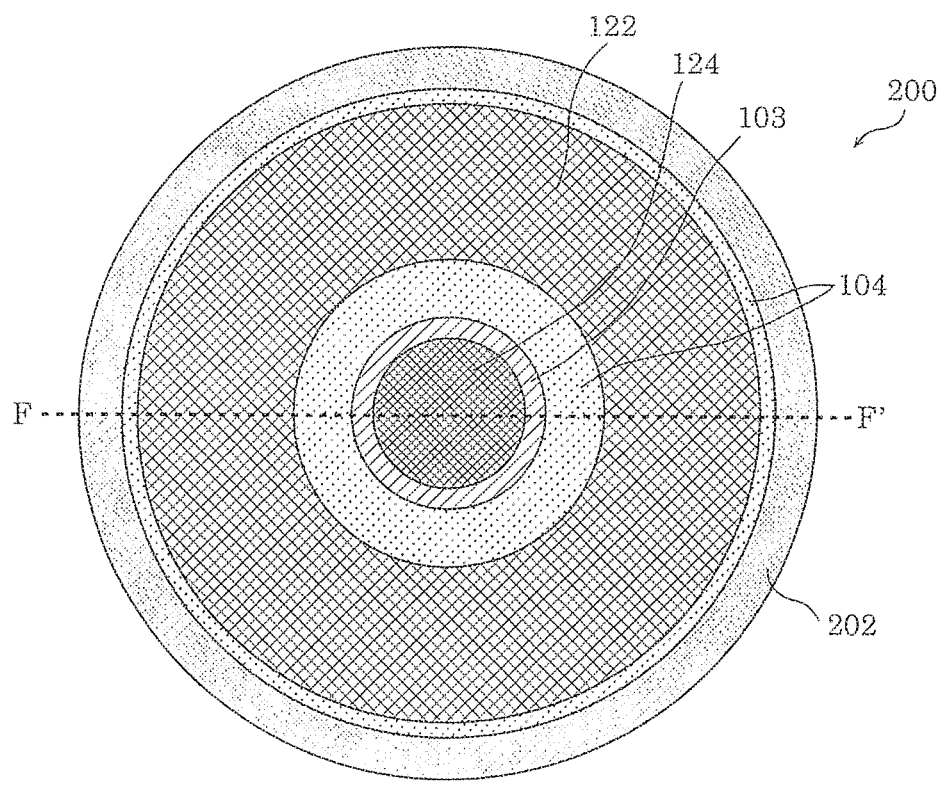
FIG. 11 is a plan view of a semiconductor device according to Embodiment 2.
Figure 12:
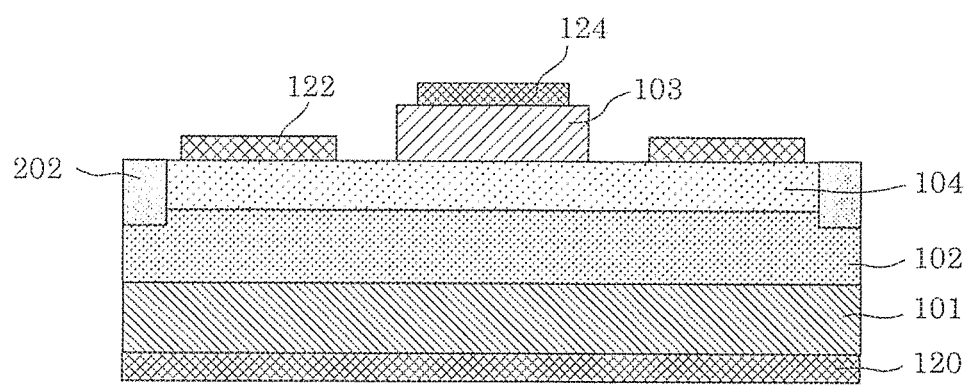
FIG. 12 is a cross-sectional view, at an F-F' line in FIG. 11, of the semiconductor device according to Embodiment 2.

FIG. 11 is a plan view of semiconductor device 200 according to Embodiment 2. FIG. 12 is a cross-sectional view, at an F-F' line in FIG. 11, of semiconductor device 200 according to Embodiment 2.

As illustrated in FIG. 11, semiconductor device 200 according to Embodiment 2 further includes third nitride semiconductor layer 104 which is disposed between first nitride semiconductor layer 102 and second nitride semiconductor layer 103 and includes a donor impurity such as silicon, as illustrated in FIG. 12. As a material of third nitride semiconductor layer 104, GaN may be used, for example. Silicon concentration may be greater than or equal to $1 \times 10^{17}/cm^2$, for example. A film thickness of third nitride semiconductor layer 104 may be 100 nm, for example.

In semiconductor device 200, first electrode 120 may be a drain electrode and second electrode 122 may be a source electrode. Alternatively, first electrode 120 may be a source electrode and second electrode 122 may be a drain electrode.

Regarding a manufacturing method of semiconductor device 200, third nitride semiconductor layer 104 may be formed by, for example, MOCVD after first nitride semiconductor layer 102 is formed and before second nitride semiconductor layer 103 is formed.

Furthermore, in third nitride semiconductor layer 104, there are electrons having high density due to a donor impurity, which allows the electrons and holes to recombine with an increased possibility.

Accordingly, semiconductor device 200 according to Embodiment 2 allows light emission with higher efficiency than in semiconductor device 100 according to Embodiment 1, which lowers the on-resistance than in semiconductor device 100 according to Embodiment 1.

Embodiment 3

Next, semiconductor device 300 according to Embodiment 3 will be described.

Figure 13:
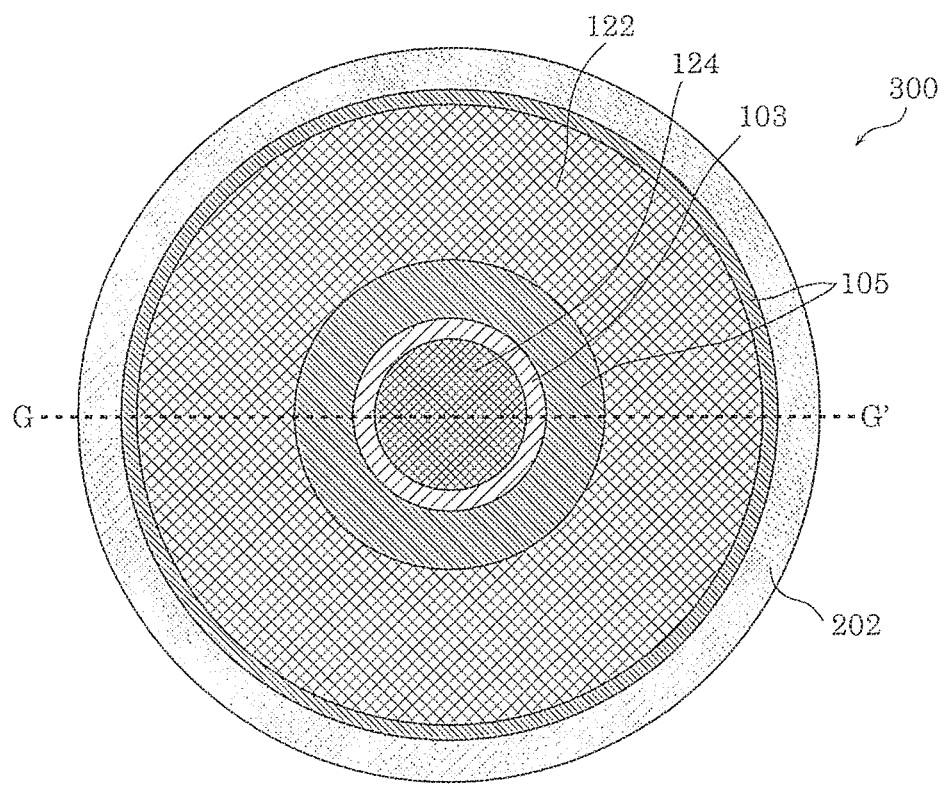
FIG. 13 is a plan view of a semiconductor device according to Embodiment 3.
Figure 14:
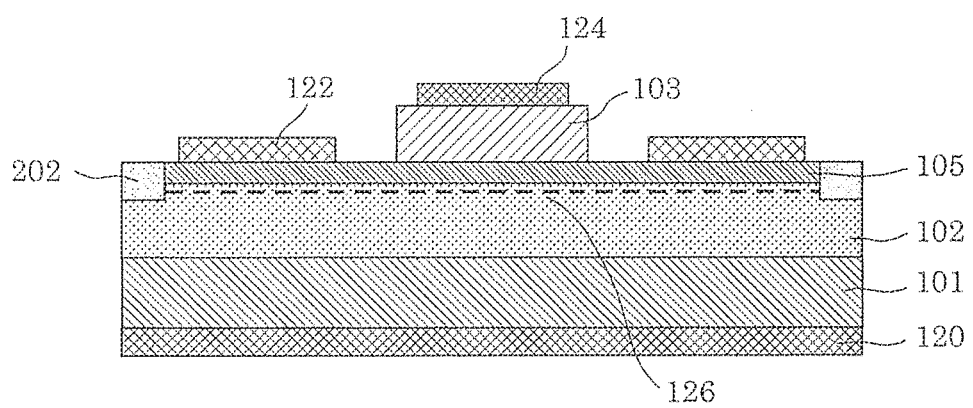
FIG. 14 is a cross-sectional view, at a G-G' line in FIG. 13, of the semiconductor device according to Embodiment 3.

FIG. 13 is a plan view of semiconductor device 300 according to Embodiment 3, and FIG. 14 is a cross-sectional view, at a G-G' line in FIG. 13, of semiconductor device 300 according to Embodiment 3.

As illustrated in FIG. 13, semiconductor device 300 according to Embodiment 3 includes fourth nitride semiconductor layer 105 which is disposed between first nitride semiconductor layer 102 and second nitride semiconductor layer 103 and has a band gap greater than a band gap of first nitride semiconductor layer 102. When first nitride semiconductor layer 102 includes GaN, $Al_{0.3}Ga_{0.7}N$ may be used as a material for fourth nitride semiconductor layer 105, for example. The film thickness of $Al_{0.3}Ga_{0.7}N$ may be approximately 20 nm, for example.

In semiconductor device 300, first electrode 120 may be a drain electrode and second electrode 122 may be a source electrode. Alternatively, first electrode 120 may be a source electrode and second electrode 122 may be a drain electrode.

Regarding a manufacturing method of semiconductor device 300, fourth nitride semiconductor layer 105 may be formed by, for example, MOCVD after first nitride semiconductor layer 102 is formed and before second nitride semiconductor layer 103 is formed.

Furthermore, as illustrated in FIG. 14, two-dimensional electron gas 126 having high density due to spontaneous polarization and piezoelectric polarization is formed between first nitride semiconductor layer 102 and fourth nitride semiconductor layer 105. Therefore, when a voltage is applied to gate electrode 124, holes are injected to two-dimensional electron gas 126, which allows the electrons having high density and the holes to recombine.

Accordingly, semiconductor device 300 according to Embodiment 3 allows light emission with higher efficiency than in semiconductor device 100 according to Embodiment 1, which lowers the on-resistance than in Embodiment 1.

Note that the present embodiment may be combined with Embodiment 2. In other words, third nitride semiconductor layer 104 described in Embodiment 2 may be disposed between one of (i) second nitride semiconductor layer 103 and fourth nitride semiconductor layer 105 and (ii) first nitride semiconductor layer 102 and fourth nitride semiconductor layer 105.

Variation of Embodiment 3

Next, semiconductor device 300a according to Variation of Embodiment 3 will be described.

Figure 15:
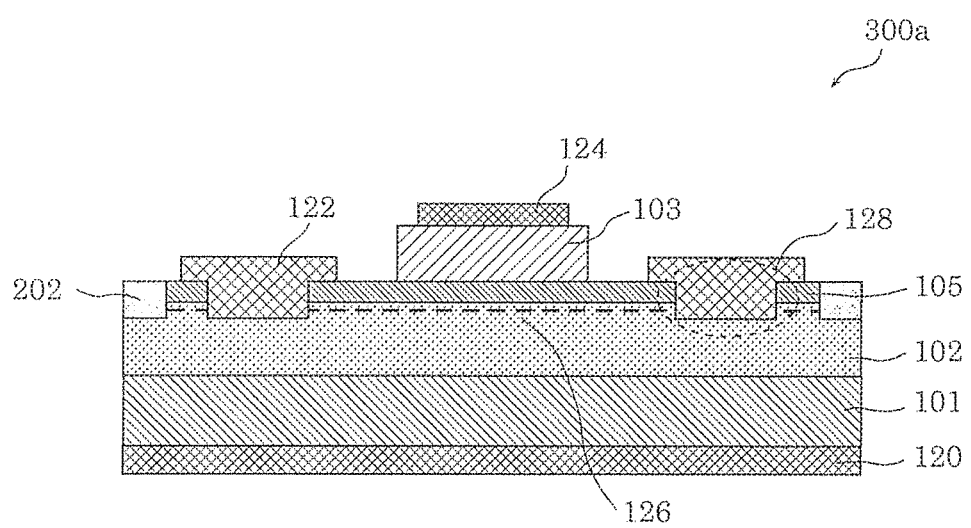
FIG. 15 is a cross-sectional view of a semiconductor device according to Variation of Embodiment 3.

FIG. 15 is a cross-sectional view of semiconductor device 300a according to Variation of Embodiment 3. The plan view of semiconductor device 300a is not shown as semiconductor device 300a has substantially the same structure as semiconductor device 300 illustrated in FIG. 13.

Semiconductor device 300a according to the present variation includes, as illustrated in FIG. 13, first recess 128 penetrating through fourth nitride semiconductor layer 105 and reaching at least first nitride semiconductor layer 102. Second electrode 122 is disposed to fill first recess 128. Second electrode 122 may be in contact with two-dimensional electron gas 126. This structure allows lowering the contact resistance between first nitride semiconductor layer 102 and second electrode 122, which lowers the on-resistance even further.

Regarding a manufacturing method of semiconductor device 300a, for example, after dry etching second nitride semiconductor layer 103, a resist is applied above fourth nitride semiconductor layer 105, and patterning is performed. After the resist patterning, dry etching may be performed on fourth nitride semiconductor layer 105 and first nitride semiconductor layer 102 to form first recess 128.

Embodiment 4

Next, semiconductor device 400 according to Embodiment 4 will be described.

Figure 16:
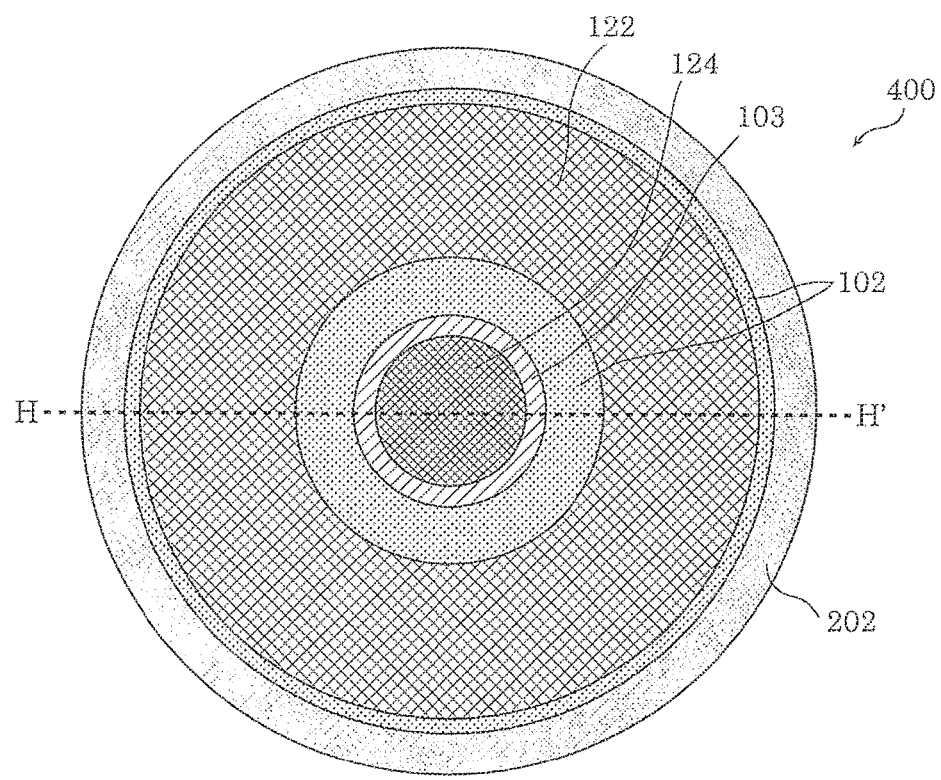
FIG. 16 is a plan view of a semiconductor device according to Embodiment 4.
Figure 17:
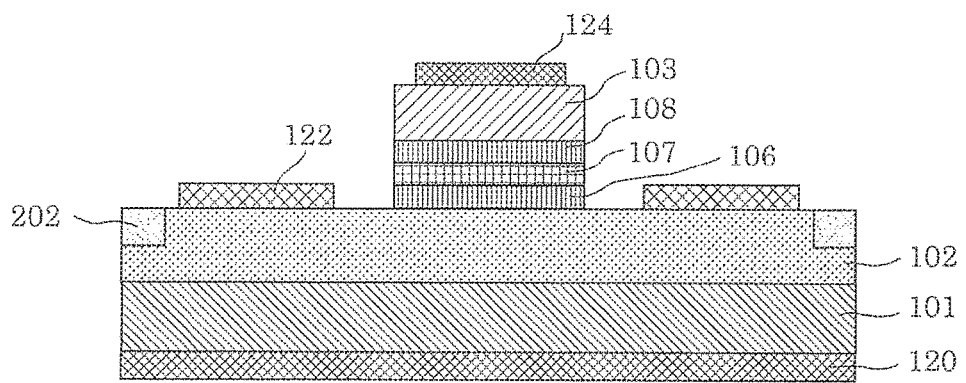
FIG. 17 is a cross-sectional view, at an H-H' line in FIG. 16, of the semiconductor device according to Embodiment 4.

FIG. 16 is a plan view of semiconductor device 400 according to Embodiment 4. FIG. 17 is a cross-sectional view, at an H-H' line in FIG. 16, of semiconductor device 400 according to Embodiment 4.

In semiconductor device 400 according to Embodiment 4, as illustrated in FIG. 16 and FIG. 17, fifth nitride semiconductor layer 106, sixth nitride semiconductor layer 107, and seventh nitride semiconductor layer 108 are stacked between first nitride semiconductor layer 102 and second nitride semiconductor layer 103 in stated order from first nitride semiconductor layer 102.

A band gap of fifth nitride semiconductor layer 106 is greater than or equal to a band gap of first nitride semiconductor layer 102. A band gap of sixth nitride semiconductor layer 107 is smaller than the band gap of fifth nitride semiconductor layer 106. A band gap of sixth nitride semiconductor layer 107 is smaller than the band gap of fifth nitride semiconductor layer 106. A band gap of seventh nitride semiconductor layer 108 is greater than or equal to the band gap of first nitride semiconductor layer 102 and greater than the band gap of sixth nitride semiconductor layer 107. Note that fifth nitride semiconductor layer 106 and seventh nitride semiconductor layer 108 may include a same material.

In semiconductor device 400, first electrode 120 may be a drain electrode and second electrode 122 may be a source electrode. Alternatively, first electrode 120 may be a source electrode and second electrode 122 may be a drain electrode.

With this structure, at sixth nitride semiconductor layer 107, a quantum level is formed due to containment of electrons and holes by fifth nitride semiconductor layer 106 and seventh nitride semiconductor layer 108. This containment of electrons and holes in the quantum level allows electrons and holes to recombine with an improved possibility.

Accordingly, semiconductor device 400 according to Embodiment 4 allows light emission with higher efficiency than in semiconductor device 100 according to Embodiment 1, which lowers the on-resistance than in semiconductor device 100 according to Embodiment 1.

Note that fifth nitride semiconductor layer 106, sixth nitride semiconductor layer 107, and seventh nitride semiconductor layer 108 may have a Multiple Quantum Well (MQW) structure in which the layers are sequentially and repeatedly formed, and may include three periods, i.e. three layers of sixth nitride semiconductor layer 107 in which the quantum level is formed.

Furthermore, fifth nitride semiconductor layer 106 and seventh nitride semiconductor layer 108 include $Al_{0.1}Ga_{0.9}N$ having a film thickness of 10 nm, for example. Sixth nitride semiconductor layer 107 includes GaN having a film thickness of 3 nm, for example.

Regarding a manufacturing method of semiconductor device 400, fifth nitride semiconductor layer 106, sixth nitride semiconductor layer 107, and seventh nitride semiconductor layer 108 may be sequentially formed by, for example, MOCVD after first nitride semiconductor layer 102 is formed and before second nitride semiconductor layer 103 is formed. Then, after second nitride semiconductor layer 103 is formed, a resist is applied above second nitride semiconductor layer 103, and patterning is performed. After the resist patterning, dry-etching is performed on second nitride semiconductor layer 103, fifth nitride semiconductor layer 106, sixth nitride semiconductor layer 107, and seventh nitride semiconductor layer 108, to expose first nitride semiconductor layer 102.

With this structure, semiconductor device 400 according to Embodiment 4 allows light emission with higher efficiency, which lowers the on-resistance than in semiconductor device 100 according to Embodiment 1.

Variation 1 of Embodiment 4

Next, semiconductor device 400a according to Variation 1 of Embodiment 4 will be described.

Figure 18:
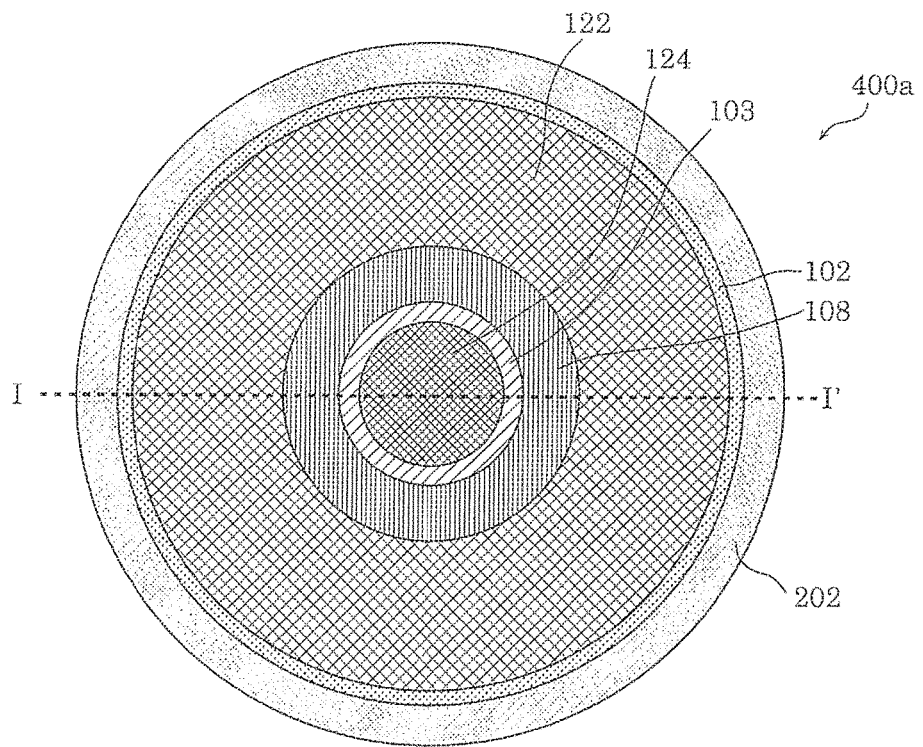
FIG. 18 is a plan view of a semiconductor device according to Variation 1 of Embodiment 4.
Figure 19:
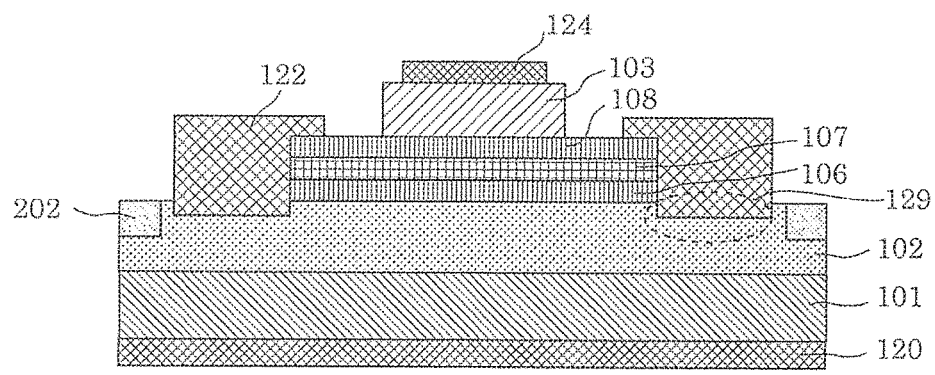
FIG. 19 is a cross-sectional view, at an I-I' line in FIG. 18, of the semiconductor device according to Variation 1 of Embodiment 4.

FIG. 18 is a plan view of semiconductor device 400a according to Variation 1 of Embodiment 4. FIG. 19 is a cross-sectional view, at an I-I' line in FIG. 18, of semiconductor device 400a according to Variation 1 of Embodiment 4.

In semiconductor device 400a according to the present variation, as illustrated in FIG. 18 and FIG. 19, second electrode 122 is formed to fill second recess 129 formed in first nitride semiconductor layer 102, and is in contact with a lateral surface of each of fifth nitride semiconductor layer 106, sixth nitride semiconductor layer 107, and seventh nitride semiconductor layer 108. By second electrode 122 being in contact with the two-dimensional electron gas (not shown) formed at the interface between fifth nitride semiconductor layer 106 and first nitride semiconductor layer 102, contact resistance between first nitride semiconductor layer 102 and second electrode 122 can be lowered. With this, the on-resistance of semiconductor device 400a can be further lowered.

Variation 2 of Embodiment 4

Next, semiconductor device 400b according to Variation 2 of Embodiment 4 will be described.

Figure 20:
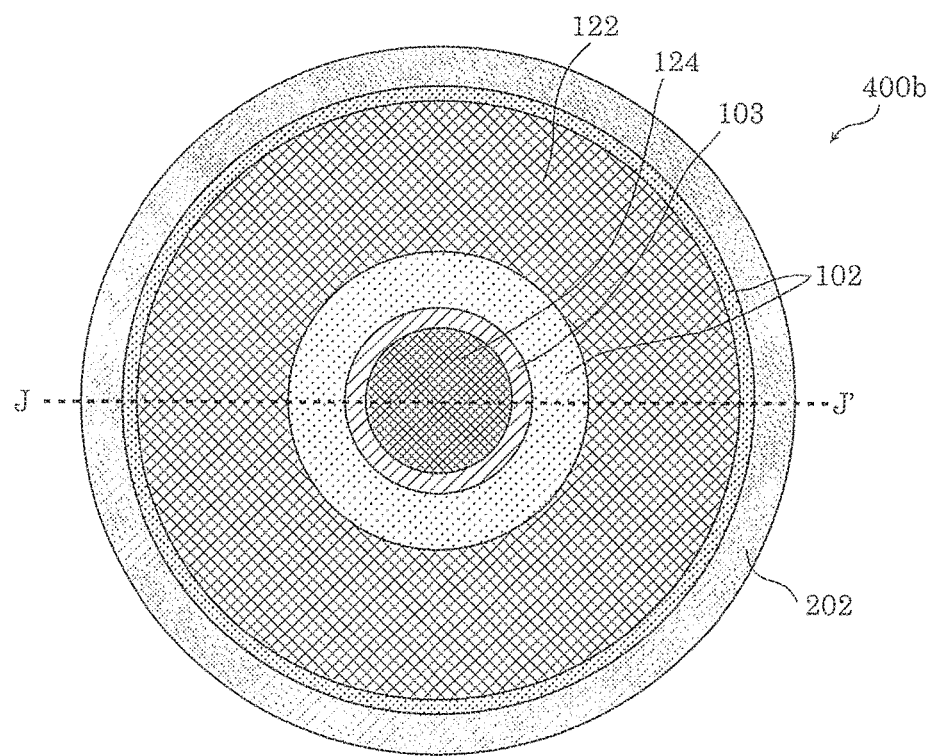
FIG. 20 is a plan view of a semiconductor device according to Variation 2 of Embodiment 4.
Figure 21:
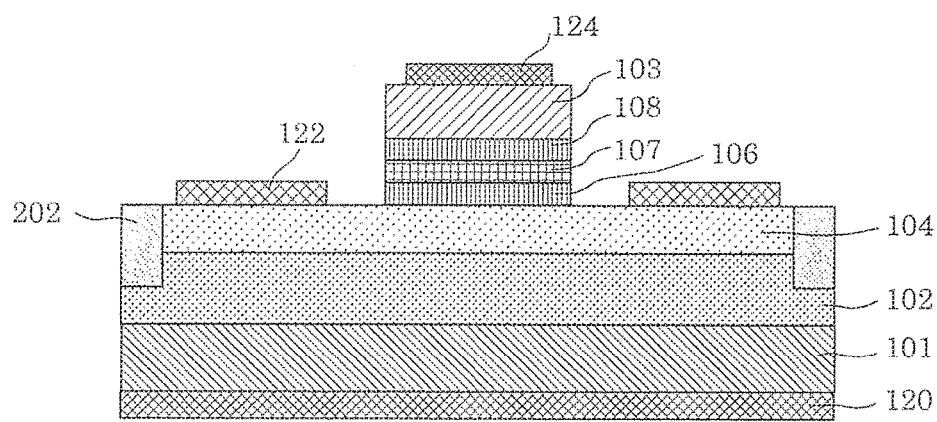
FIG. 21 is a cross-sectional view, at a J-J' line in FIG. 20, of the semiconductor device according to Variation 2 of Embodiment 4.

FIG. 20 is a plan view of semiconductor device 400b according to Variation 2 of Embodiment 4. FIG. 21 is a cross-sectional view, at a J-J' line in FIG. 20, of semiconductor device 400b according to Variation 2 of Embodiment 4.

In semiconductor device 400b according to the present variation, as illustrated in FIG. 20 and FIG. 21, third nitride semiconductor layer 104 may be formed which is disposed between first nitride semiconductor layer 102 and second nitride semiconductor layer 103 and includes a donor impurity such as silicon. This structure causes electrons having higher density to flow from third nitride semiconductor layer 104 to sixth nitride semiconductor layer 107. As a result, at a quantum level of sixth nitride semiconductor layer 107, the electrons and holes recombine with even higher possibility. Accordingly, semiconductor device 400b can further lower the on-resistance by causing light emission with higher efficiency.

Variation 3 of Embodiment 4

Next, semiconductor device 400c according to Variation 3 of Embodiment 4 will be described.

Figure 22:
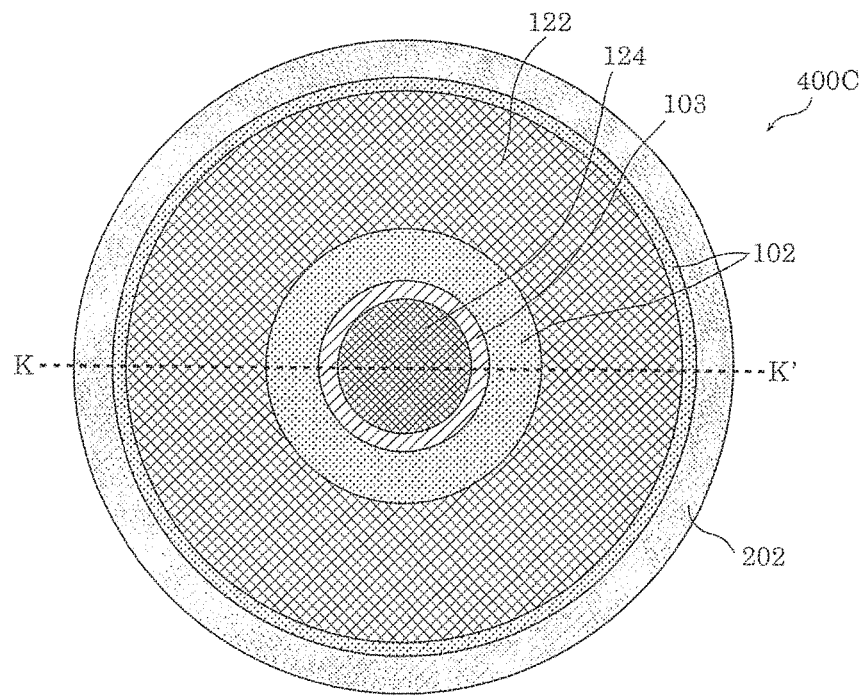
FIG. 22 is a plan view of a semiconductor device according to Variation 3 of Embodiment 4.
Figure 23:
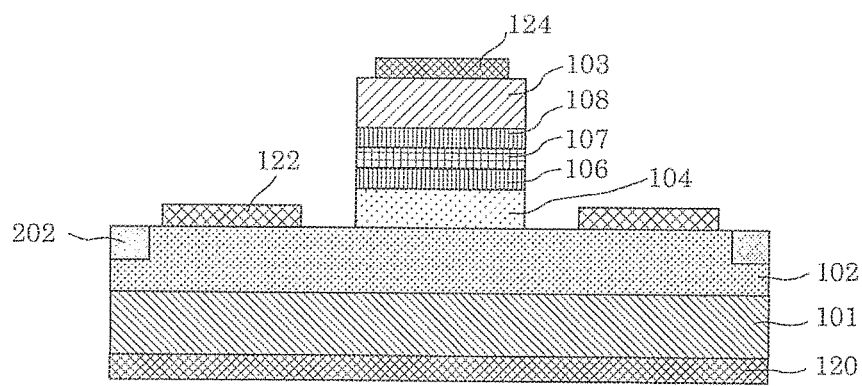
FIG. 23 is a cross-sectional view, at a K-K' line in FIG. 22, of the semiconductor device according to Variation 3 of Embodiment 4.

FIG. 22 is a plan view of semiconductor device 400c according to Variation 3 of Embodiment 4. FIG. 23 is a cross-sectional view, at a K-K' line in FIG. 22, of semiconductor device 400c according to Variation 3 of Embodiment 4.

Semiconductor device 400c according to the present variation differs from semiconductor device 400b according to Variation 2 in that, as illustrated in FIG. 22 and FIG. 23, a lateral surface of third nitride semiconductor layer 104 is formed on a plane which is approximately the same as the plane on which fifth nitride semiconductor layer 106, sixth nitride semiconductor layer 107, seventh nitride semiconductor layer 108, and second nitride semiconductor layer 103 are formed. Here, the "approximately the same" includes errors involved with manufacturing.

This structure makes it possible to (i) make the distance between the source electrode and the drain electrode closer and (ii) cause electrons having a higher density to flow from third nitride semiconductor layer 104 to sixth nitride semiconductor layer 107, as compared with those in semiconductor device 400b according to Variation 2. As a result, at the quantum level of sixth nitride semiconductor layer 107, electrons and holes recombine with an even improved possibility. Accordingly, semiconductor device 400c can further lower the on-resistance by causing light emission with a higher efficiency.

The foregoing has described the semiconductor device according to embodiments of the present disclosure, however, the present disclosure is not limited to these embodiments.

For example, regarding the conductivity type of the semiconductor substrate, in the embodiment described above, the first conductivity type is defined as N-type and the second conductivity type is defined as P-type. However, the first conductivity type may be defined as P-type and the second conductivity type may be defined as N-type.

Note that, in a plan view, each nitride semiconductor layer is not limited to have a circular shape but may have a multangular shape including square and so on. Furthermore, disposition of each nitride semiconductor layer is not specifically limited, and any disposition may be adopted as long as the device works normally.

The present disclosure is not limited to the above-described embodiments, and other forms in which various modifications apparent to those skilled in the art are applied to the embodiments, or forms structured by combining constituent elements of different embodiments may be included within the scope of one or more embodiments, unless such changes and modifications depart from the scope of the present disclosure.

INDUSTRIAL APPLICABILITY

The nitride semiconductor device according to the present disclosure can be used as a high-output high-BV transistor for use in power source circuits and so on of consumer products.

What is claimed is:

1. A nitride semiconductor device, comprising:
a substrate of a first conductivity type having a first surface and a second surface on a side of the substrate opposite the first surface;
a first nitride semiconductor layer of the first conductivity type which is disposed on the first surface of the substrate and includes an acceptor impurity;
a second nitride semiconductor layer of a second conductivity type disposed on the first nitride semiconductor layer, the second conductivity type being opposite to the first conductivity type;
a first electrode disposed on the second surface of the substrate;
a second electrode disposed on the first nitride semiconductor layer; and
a gate electrode disposed on the second nitride semiconductor layer.

2. The nitride semiconductor device according to claim 1, further comprising
a third nitride semiconductor layer of the first conductivity type which is disposed between the first nitride semiconductor layer and the second nitride semiconductor layer and includes a donor impurity.

3. The nitride semiconductor device according to claim 2, wherein the donor impurity is silicon.

4. The nitride semiconductor device according to claim 1, further comprising
a fourth nitride semiconductor layer of the first conductivity type which is disposed between the first nitride semiconductor layer and the second nitride semiconductor layer and has a band gap greater than a band gap of the first nitride semiconductor layer.

5. The nitride semiconductor device according to claim 4, further comprising
a first recess penetrating through the fourth nitride semiconductor layer and reaching at least the first nitride semiconductor layer,
wherein the second electrode is disposed to fill the first recess.

6. The nitride semiconductor device according to claim 5, wherein two-dimensional electron gas is formed at an interface between the first nitride semiconductor layer and the fourth nitride semiconductor layer, and
the second electrode is in contact with the two-dimensional electron gas.

7. The nitride semiconductor device according to claim 1, further comprising
a fifth nitride semiconductor layer, a sixth nitride semiconductor layer, and a seventh nitride semiconductor layer stacked between the first nitride semiconductor layer and the second nitride semiconductor layer in stated order from the first nitride semiconductor layer,
wherein a band gap of the fifth nitride semiconductor layer is greater than or equal to a band gap of the first nitride semiconductor layer,
a band gap of the sixth nitride semiconductor layer is smaller than the band gap of the fifth nitride semiconductor layer, and
a band gap of the seventh nitride semiconductor layer is greater than or equal to the band gap of the first nitride semiconductor layer and greater than the band gap of the sixth nitride semiconductor layer.

8. The nitride semiconductor device according to claim 7, wherein the fifth nitride semiconductor layer and the seventh nitride semiconductor layer include a same material.

9. The nitride semiconductor device according to claim 8, further comprising
a second recess formed in the first nitride semiconductor layer,
wherein the second electrode is formed to fill the second recess and is in contact with a lateral surface of each of the fifth nitride semiconductor layer, the sixth nitride semiconductor layer, and the seventh nitride semiconductor layer.

10. The nitride semiconductor device according to claim 9, wherein two-dimensional electron gas is formed at an interface between the first nitride semiconductor layer and the fifth nitride semiconductor layer, and
the second electrode is in contact with the two-dimensional electron gas.

11. The nitride semiconductor device according to claim 1, wherein the acceptor impurity is one of carbon and transition metal.

12. The nitride semiconductor device according to claim 1, wherein the gate electrode includes a plurality of gate electrodes, and
the second electrode is disposed between the plurality of gate electrodes.

13. The nitride semiconductor device according to claim 12, wherein, in a plan view, each of the plurality of gate electrodes has one of a circular shape, a multangular shape, and a slit shape.

14. The nitride semiconductor device according to claim 1, wherein the second electrode includes a plurality of second electrodes, and
the gate electrode is disposed between the plurality of second electrodes.

15. The nitride semiconductor device according to claim 14,
wherein, in a plan view, each of the plurality of second electrodes has one of a circular shape, a multangular shape, and a slit shape.

16. The nitride semiconductor device according to claim 1,
wherein the first electrode is a drain electrode and the second electrode is a source electrode.

17. The nitride semiconductor device according to claim 1,
wherein the first electrode is a source electrode and the second electrode is a drain electrode.

18. The nitride semiconductor device according to claim 16,
wherein the drain electrode is a schottky electrode.

19. The nitride semiconductor device according to claim 17,
wherein the drain electrode is a schottky electrode.

* * * * *